US005719944A

United States Patent [19]
Banerjea

[11] Patent Number: 5,719,944
[45] Date of Patent: Feb. 17, 1998

[54] SYSTEM AND METHOD FOR CREATING A DOPPLER EFFECT

[75] Inventor: Raja Banerjea, Tinton Falls, N.J.

[73] Assignee: Lucent Technologies Inc., Murray Hill, N.J.

[21] Appl. No.: 691,972

[22] Filed: Aug. 2, 1996

[51] Int. Cl.[6] .......... H03G 3/00

[52] U.S. Cl. .......... 381/61; 84/603

[58] Field of Search .......... 381/17, 18, 1, 381/61, 62, 63; 364/724.1, 723; 375/350; 84/603, 604, 605, 606

[56] References Cited

U.S. PATENT DOCUMENTS

| | | | |
|---|---|---|---|
| 3,997,772 | 12/1976 | Crochiere et al. | 364/724.1 |
| 4,472,785 | 9/1984 | Kasuga | 364/724.1 |
| 4,792,974 | 12/1988 | Chace | 381/17 |
| 5,337,363 | 8/1994 | Platt | 381/17 |
| 5,633,993 | 5/1997 | Redmann et al. | 381/61 |
| 5,636,283 | 6/1997 | Hill et al. | 381/17 |

OTHER PUBLICATIONS

Crochiere, Ronald E. and Lawrence R. Rabiner, *Multirate Digital Signal Processing*, "Sampling Rate Conversion –A Direct Digital Approach," Prentice–Hall, Inc., Englewod Cliffs, NJ, 1983, pp. 31–39.

*Primary Examiner*—Curtis Kuntz
*Assistant Examiner*—Ping W. Lee
*Attorney, Agent, or Firm*—Robert R. Axenfeld

[57] ABSTRACT

System and method for creating a Doppler Effect signal in a virtual reality environment. A host produces: (1) an audio signal indicative of sound produced by a sound source, (2) a first set of signals indicative of a velocity of the sound source and an observer of the sound source, and (3) a second set of signals indicative of a position of the sound source and the observer. An interpolator interpolates the audio signal and generates an interpolation signal. A Doppler engine receives the first and second sets of signals and generates a decimation factor signal. A decimator filter, receives the interpolation signal and the decimation factor signal and generates a decimation signal. The decimation signal is a digital representation of said Doppler Effect signal and can be converted to an analog signal for broadcast to a listener.

17 Claims, 3 Drawing Sheets

SYSTEM AND METHOD FOR CREATING A DOPPLER EFFECT

FIELD OF THE INVENTION

The present invention relates generally to enhancing sound quality in a multimedia environment, and more specifically, to a system and method for creating a Doppler Effect in a multimedia environment.

BACKGROUND OF THE INVENTION

When a source of sound, observer of sound, or both, move relative to one another, the observed frequency of the sound changes: known as the Doppler Effect or Doppler Shift. Virtual reality systems (such as computer games, simulators, and other related systems), attempt to create the Doppler Effect through dedicated hardware and/or software operating in the frequency domain. Generally, an audio signal, produced by the virtual reality system, is processed through the dedicated hardware/software (i.e., the signal is passed through a fast Fourier transformer and/or a frequency shifter and finally a Fourier transform filter) to produce a frequency transformed digital audio signal with Doppler Effect. The transformed digital audio signal is then converted to an analog signal and broadcast to a listener.

To create the Doppler Effect in the frequency domain requires significant computing resources. Often it is not possible to produce realistic Doppler Effect sounds in real-time. It is especially difficult to simulate the Doppler Effect for sound sources that produce audio signals in broadband frequency ranges (such as music and speech) in the range of 20 to 20,000 Hertz, due to the enormous quantity of signal processing to be performed over the entire frequency range. Moreover, such signal processing may require time-consuming floating-point operations and massive storage, tending to impede the speed of the system and its ability to create a realistic Doppler Effect sound in real-time.

What is needed, therefore, is a system and method to realistically simulate the Doppler Effect of sound-source-audio-signals, in real-time, including broadband frequency audio signals.

SUMMARY OF THE INVENTION

The present invention is directed to a system and method for creating an audio signal with a Doppler Effect in a virtual reality environment. The Doppler Effect signal is representative of a change in frequency of an audio signal produced by a sound source when the sound source and/or an observer of the sound source move relative to each other.

In an exemplary embodiment, three types of signals are processed: (1) an audio signal indicative of sound produced by a sound source, (2) a first set of signals indicative of a velocity of the sound source and an observer of the sound source, and (3) a second set of signals indicative of a position of the sound source and the observer. An interpolator interpolates the audio signal and generates an interpolation signal. A Doppler engine receives the first and second sets of signals and generates a decimation factor signal. A decimator filter, coupled to the interpolator and Doppler engine, receives the interpolation signal and the decimation factor signal and generates a decimation signal.

In one embodiment the decimation signal is a digital representation of said Doppler Effect signal and can be converted to an analog audio signal for broadcast to a listener via a transducer.

The present invention is able to produce a realistic simulation of the Doppler Shift for a wide range of signal frequencies, (including broadband signals such as music) in real-time by operating in the time domain as opposed to the frequency domain.

Other features and advantages of the present invention will become apparent after reading the foregoing description.

DETAILED DESCRIPTION OF THE INVENTION

Figure 1:
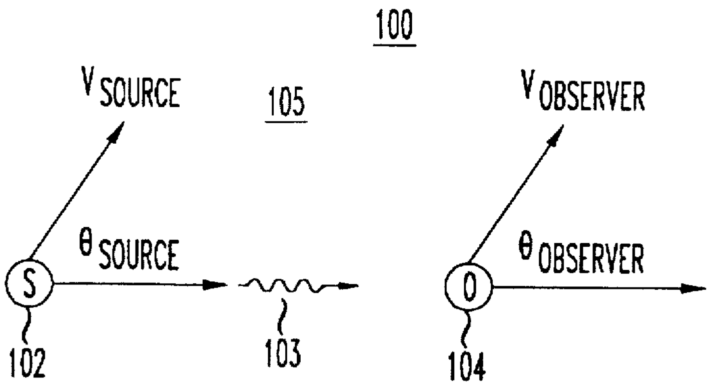
FIG. 1 is a diagram of a virtual reality environment having two objects, a sound source and observer, in motion relative to each other.

The present invention is directed to a system and method for creating a Doppler Effect signal in a virtual reality environment. FIG. 1 is a diagram of such a virtual reality environment 100 including a sound source 102 and an observer 104. The sound source 102 produces an audio signal 103. The observer 104 is an object capable of observing the sound produced by the sound source 102 via audio signal 103. A physical medium 105 between the sound source 102 and the observer 104 may be any type of medium (i.e., air and water) capable of carrying an audio signal 103. The Doppler Effect signal (not shown) is representative of a change in frequency of the audio signal 103 produced when the sound source 102 when the sound source 102 and/or the observer 104 move relative to each other. The velocities and direction of the sound source 102 and the observer 104 are represented by the vector arrows to be described in more detail below.

Figure 2:
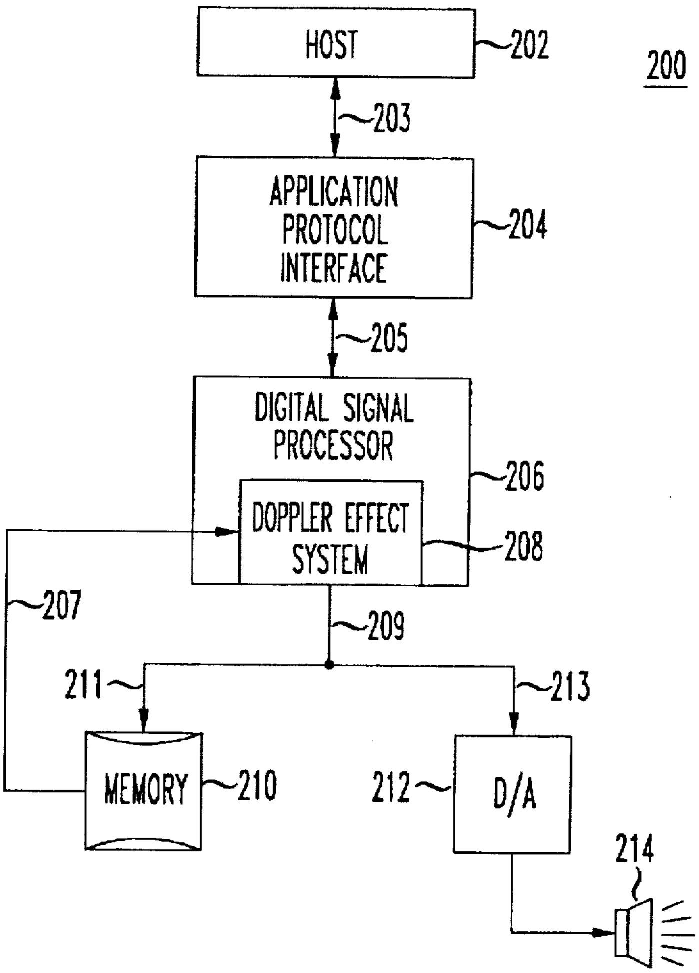
FIG. 2 is a block diagram of a virtual reality system according to an exemplary embodiment of the present invention.

FIG. 2 is a block diagram of a virtual reality system 200 according to an exemplary embodiment of the present invention. The virtual reality system 200 includes a host 202, an application protocol interface (API) 204, a digital signal processor (DSP) 206, a Doppler Effect system 208, memory 210, a digital-to-analog converter 212, and a transducer 214, such as a speaker, headphone or load speaker.

Referring to FIGS. 1 and 2, the host 202 is any type of virtual reality device such as a computer game or a simulator. In a preferred embodiment, the host 202 produces three types of signals: (1) an audio signal 103 indicative of sound produced by the sound source 102, (2) a first set of signals indicative of a velocity of the sound source 102 and an observer 104 of the sound source 102, and (3) a second set of signals indicative of a position of the sound source and the observer. Typically, the second set of signals consists of an X,Y,Z coordinate position of the sound source 102 and observer 104. The host 202 may also generate other vectors such as the velocity of sound in the medium 105 of virtual reality environment 100. Devices other than the host 202, such as the DSP 206, may be configured to produce the aforementioned signals.

The Application Protocol Interface (API) 204 is a software standard supported by Microsoft Corporation, Redmond, Wash. U.S.A. The API 204, however, may be any hardware or hardware emulation system (or standard) used to interface with a DSP 206. Typically, the API 204 operates under control of the host 202 and is configured to interface with digital signal processors.

The DSP 206 performs various multimedia operations on digitized waveforms. For instance, DSP 206 processes sound and video signals received from the host 202 and/or API 204. In a preferred embodiment, DSP 206 is an improved 1610 DSP model, manufactured by Lucent Technologies, Murry Hill, N.J. U.S.A.

The Doppler Effect system is shown as block 208 in FIG. 2. The Doppler Effect system 208 generates a Doppler Effect signal exemplifying a change in frequency of the audio signal 103 produced by the sound source 102 when the sound source 102 and/or the observer 104 move relative to each other. The Doppler Effect system 208 simulates the Doppler Effect by employing interpolation and decimation filters (to be described with reference to FIGS. 3 and 4). It is contemplated the Doppler Effect system 208 may be hardcoded into the DSP 206, integrated as a separate hardware device, or designed as some combination of hardware and/or software modules running from host 202. It is also contemplated that Doppler Effect system 208 may receive vector information, such as velocity vectors directly from the host 202. The Doppler Effect system 208 can also receive vector information, in digital format, from memory 210 via path 207.

For discussion purposes below, "path" implies a link (such as a bus, wire, optic fiber and the like) in hardware applications or a logical connection for the transfer of information between software modules and/or objects.

Figure 3:
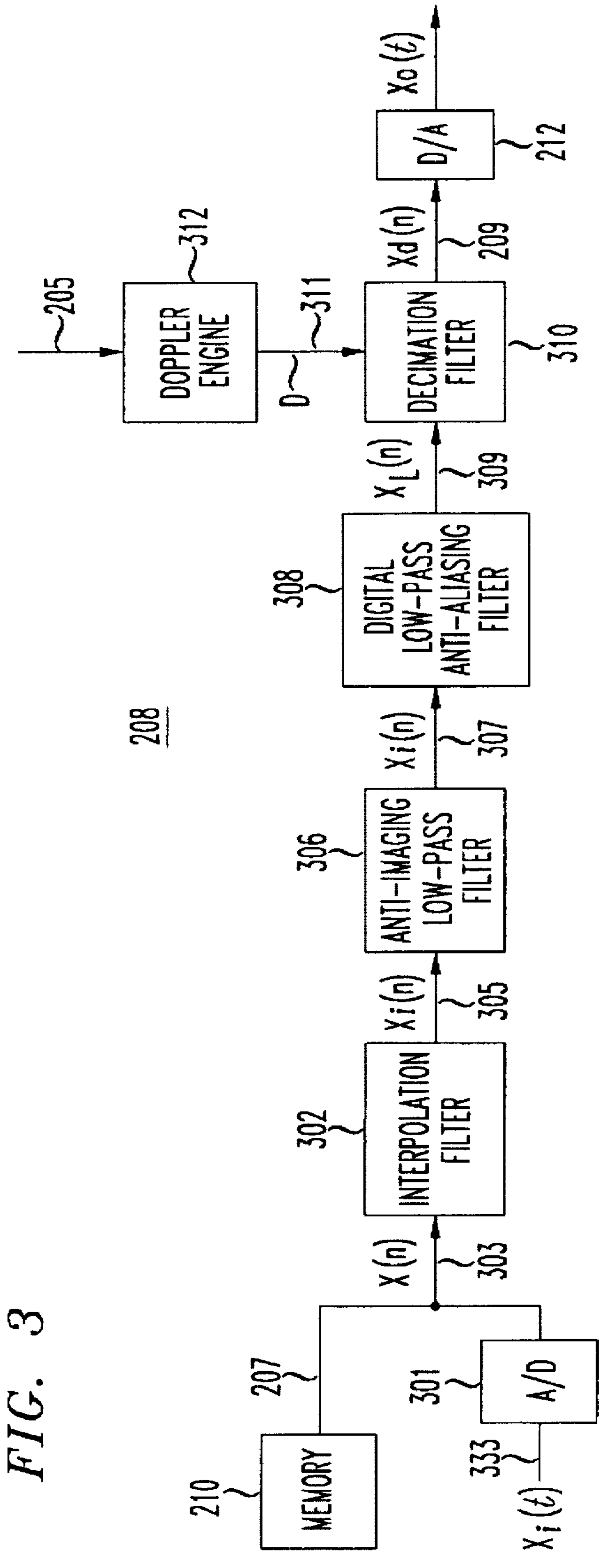
FIG. 3 is a block diagram of the Doppler Effect system according an exemplary embodiment of the present invention.

FIG. 3 is a block diagram of the Doppler Effect system 208 shown in FIG. 2. Referring to FIG. 3, the Doppler Effect system 208 includes: an analog-to-digital (A/D) converter 301, an interpolation filter 302, an anti-imaging low-pass filter 306, a digital anti-aliasing low-pass filter 308, a decimation filter 310 and a Doppler engine 312. The operation of the Doppler Effect system 208 shown in FIG. 3, will now be described in more detail with reference to the operational flow diagram of FIG. 4 which includes operational steps 402, 404, 406, 408, 410, 412, 414, and 416.

In step 402, the Doppler Effect system 208 receives the audio signal 103 (shown in FIG. 1 ) (typically a sine wave Xi (t)) via path 333. In step 404, the audio signal 103 is converted into a digital signal X(n) by the A/D converter 301. A digital representation of signal 103, can also be received from memory 210 via path 207, depending on the desired application.

In step 406, the digital signal X(n) is then passed through the interpolation filter 302. The interpolation filter 302 interpolates, increases the sampling rate of the digital signal X(n) and generates an interpolation signal $X_i(n)$, which, in a preferred embodiment, is sent to the anti-imaging low-pass filter 306. Various interpolation or sampling rates can be selected depending the application and granularity desired. The interpolation filter 302 can be expressed as:

$$X_i(n) = \begin{cases} x\{m/N\}, & m = 0, \pm N, \pm 2N, \ldots \\ 0, & \text{otherwise} \end{cases}$$

where N is the interpolation factor. It should be noted that the "interpolation filter" 302 is also referred to by those skilled in the art as an "interpolator." A more in-depth discussion on interpolation is presented in *Multirate Digital Signal Processing,* Crochiere et al., pages 35–39, Prentice Hall, Inc. 1983, incorporated herein by reference ( hereinafter referred to as "Crochiere et al").

The anti-imaging low pass filter 306 operates in the time domain and removes undesired high frequency images from the interpolation signal $X_i(n)$ cause by the interpolation filter 302. Depending on the application, other types of filters may used in place of the anti-imaging low-pass filter 306, such as a high-pass filter or a notch filter. However, for broad frequency band signals, in the 20 Hz-to-20 KHz range, such as voice and music, an anti-imaging low-pass filter 306 is desired. The anti-imaging digital low-pass filter can be expressed as:

$$\tilde{H}(e^{jw'}) = \begin{cases} G & |w'| \leqq 2\pi FT/2 = \pi/2 \\ 0, & \text{otherwise} \end{cases}$$

where G represents the gain in $\tilde{H}(e^{jw'})$, and where $w'2\pi fT$. A more in-depth discussion on anti-imaging digital low-pass filters is presented Crochiere et al., pages 35–39, Prentice Hall, Inc. 1983, incorporated herein by reference.

In a preferred embodiment, the interpolation signal $X_i(n)$ is then passed through a digital low-pass anti-aliasing filter 308. The digital low-pass anti-aliasing filter 308 further approximates the ideal characteristics of the interpolation signal $X_i(n)$ before it is sent to the decimation filter 310. The expression for the digital low-pass anti-aliasing filter 308 is similar to filter 306, however, it is desired to have a gain of 1. Again, it is understood that other filter designs can be selected in place of the digital low-pass filter, such as a high-pass filter depending on the application and characteristics of the host 102, as would be appreciated by those skilled in the art. It is also appreciated that the anti-imaging low-pass filter 306 and the digital low-pass anti-aliasing filter 308 can be combined into a single filter exhibiting the characteristics of both filters. It is also appreciated that the functionality of filters 306,308 can be designed into the interpolation filter 302 and/or the decimation filter 310. A more in-depth discussion on anti-aliasing digital low-pass filters is presented in Crochiere et al., pages 31–35, Prentice Hall, Inc. 1983, incorporated herein by reference.

Next, in step 408, the first set of signals indicating the velocities of both the sound source 102 and the observer 104 and the second set of signals indicating the position of the sound source 102 and the observer 104 are received by the Doppler engine 312 via path 205. Based on the first and second sets of signals, the Doppler engine 312 generates a decimation factor signal (D) which is sent to the decimation filter 310 via path 311. The functionality of the Doppler engine 312 can be expressed in simplified form as $D=N(1+V_{rel}/V)$, where V is the velocity of sound in the medium 105, where N is the interpolation factor used depending on the desired granularity level of the sound for the application (i.e., whether a game, simulator, medium, etc.) and where $V_{rel}=V_{source} \cos \theta_{souce}-V_{observer} \cos \theta_{observer}$ as derived from FIG. 1. $V_{rel}$ is positive if both the sound source 102 and the observer 104 are moving towards each other and negative if 102, 104 are moving away.

Figure 4:
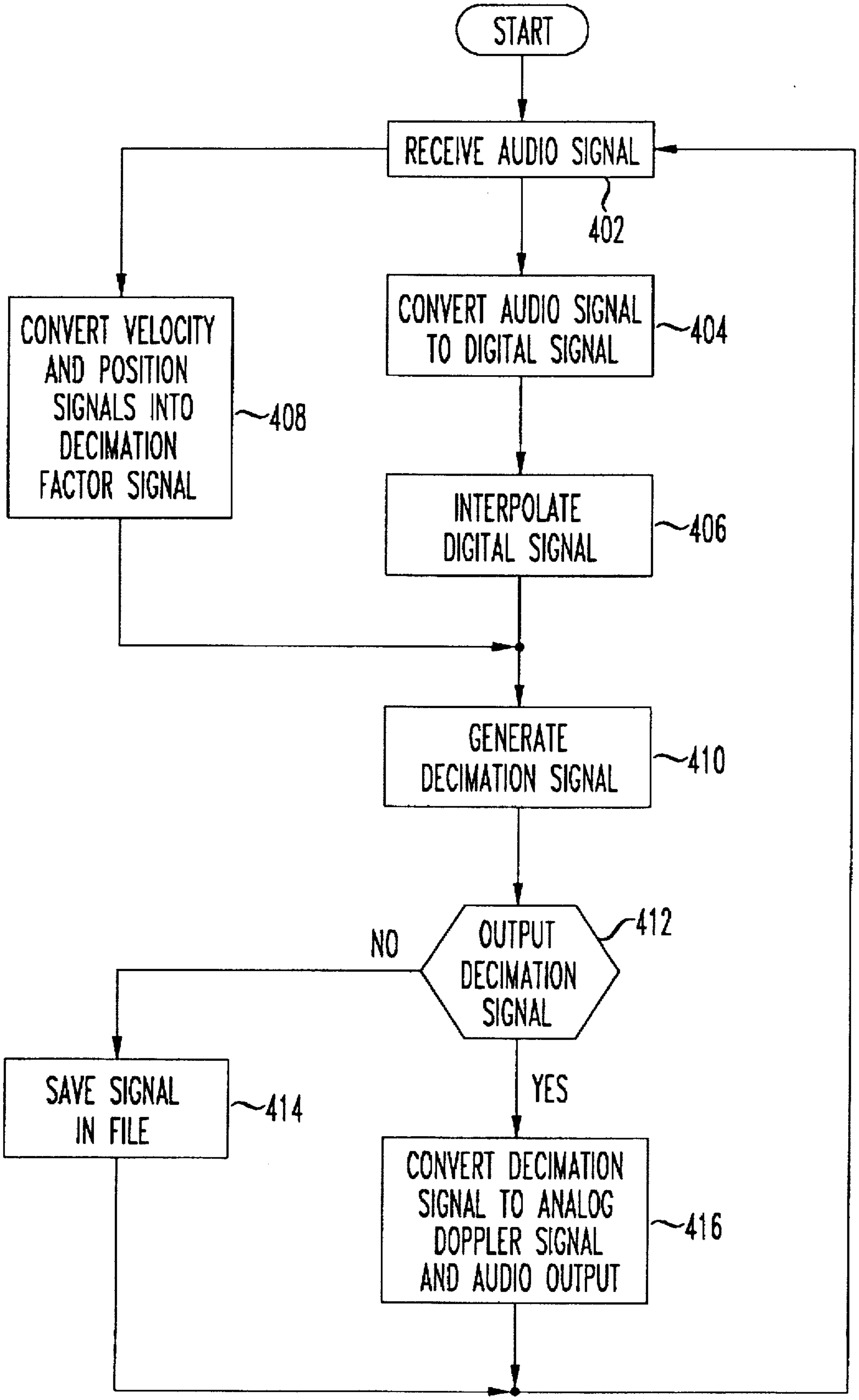
FIG. 4 is an operation flow diagram of an exemplary Doppler Effect system of the present invention.

Next, in step 410 of FIG. 4 and referring to FIGS. 2 and 3, the decimation filter (sometime referred to as a "decimator") 310 decimates the interpolation signal $X_i(n)$ based on a factor indicated by the decimation factor signal D and generates a decimation signal $X_d(n)$. In other words, the decimation filter 310 reduces the sampling rate of the interpolation signal $X_i(n)$ by integer factor D determined by the Doppler engine 205. Again, a more in in-depth discussion of decimation can be found in Crochiere et al, pages 31–35, incorporated herein by reference.

In a decisional step 412, the decimation signal $X_d(n)$ can be stored in memory 211 or sent directly to the D/A converter 212 for conversion to an analog signal $X_o(t)$ (Doppler Effect signal) for broadcast to a listener (which can be observer 104) via a load speaker 214 (shown in FIG. 2). The sampling rate R of the A/D and D/A converters 301,212 should be substantially identical.

To demonstrate the operation of Doppler Effect system 208 a simplified example is set forth herein. Assume a sound source 102 is generating a 1 KHZ sine wave $X_i(t)$ and traveling toward the observer 104 at a velocity of 100 meters per second (m/s). Assume the speed of sound in the medium to be 400 m/s.

Accordingly, referring to FIG. 3, the A/D converter 301 converts the sine wave $X_i(t)$ from analog to digital format X(n), where X(n)=sin(2πn/8). For discussion purposes the sampling rate of A/D converter 301 is 8 KHZ. Next, the interpolation filter 302 generates an interpolation signal $X_i(n)$, where $X_i(n)$=sin(2πcn/8N), where N is the fixed interpolation factor rate. In this example, the interpolation factor is 20, which is the preferred factor for simulating the Doppler Effect for voice and music in an air medium. After the interpolation signal $X_i(n)$ is passed through the anti-aliasing low-pass 306 filter and the digital low-pass filter 308, the decimation filter generates a decimation signal $X_d(n)$ which can be expressed as sin(2πnD/8N) where the decimation factor signal, D, generated by the Doppler engine 312 is 25 for this example. When the decimation signal $X_d(n)$ is converted by the D/A converter 212, the listener will perceive the frequency of the sound source 102 at 1.28 KHZ. As the sound source 102 moves closer to the observer 104, the perceived frequency of the sound source will increase.

From the foregoing it is understood by those skilled in the art that the order in which filtering is performed can be rearranged without departing from the scope of the present invention. It is also understood that the various types of interpolation and decimation filters having varying characteristics can be selected without departing from the scope of the present invention.

While preferred embodiments have been set forth, various modifications, alterations, and changes may be made without departing from the spirit and scope of the present invention as defined in the specification and in the appended claims.

What is claimed is:

1. In a system capable of producing three signals: (1) an audio signal indicative of sound produced by a sound source, (2) a first set of signals indicative of a velocity of said sound source and an observer of said sound source, (3) a second set of signals indicative of a position of said sound source and said observer; a system for creating a Doppler Effect signal representative of a change in frequency of said audio signal when said sound source and/or said observer move relative to each other, said system for creating a Doppler Effect signal comprising:

an interpolator for interpolating said audio signal and generating an interpolation signal;

a Doppler engine for receiving said first and second sets of signals and generating a decimation factor signal; and a decimator filter, coupled to said interpolator and Doppler engine, for receiving said interpolation signal and said decimation factor signal and generating a decimation signal.

2. The system of claim 1, wherein said decimation signal is a digital representation of said Doppler Effect signal.

3. The system of claim 2, further comprising a digital-to-analog converter, coupled to said decimation filter, to convert said decimation signal to an analog signal.

4. The system of claim 3, further comprising a loud speaker, coupled to said digital-to-analog converter, for producing said Doppler Effect signal audible to a listener.

5. The system of claim 2, further comprising a storage device, coupled to said decimation for storing said decimation signal.

6. The system of claim 1, further comprising a host, coupled to said interpolator and Doppler engine, for producing said first and second set of signals and said audio signal.

7. The system of claim 6, further comprising an analog-to-digital converter coupled between said host and said interpolation, for converting said audio signal to a digital signal.

8. The system of claim 1, further comprising a storage device, coupled to said interpolation filter, for storing a digital signal representative of said audio signal.

9. The system of claim 1, further comprising a low-pass filter between said interpolation and said decimation filter.

10. A method for producing a Doppler Effect signal, wherein said Doppler Effect signal is representative of sound produced when a sound source and/or an observer object move relative to each other in a virtual reality system, comprising the steps of:

receiving: (1) a first set of signals indicative of a velocity of said observer object and sound source, (2) a second set of signals indicative of a position of said observer object and sound source, and (3) an audio signal indicative of sound produced by said sound source;

interpolating said audio signal into an interpolation signal;

transforming said first and second sets of signals into a decimation factor signal; and decimating said interpolation signal using said decimation factor signal into a decimation signal which is a digital representation of said Doppler effect signal.

11. The method of claim 10, further comprising the steps of converting said decimation signal into an analog signal.

12. The method of claim 10, further comprising the steps of storing said decimation signal in a storage device.

13. In a virtual reality system configured to produce three signals: (1) an audio signal indicative of sound produced by a sound source, (2) a first set of signals indicative of a velocity of said sound source and an observer of said sound source, (3) a second set of signals indicative of a position of said sound source and said observer; a system for creating a Doppler Effect signal representative of a change in frequency of said audio signal when said sound source and/or said observer move relative to each other, said system for creating a Doppler Effect signal comprising:

means for interpolating said audio signal and generating an interpolation signal;

means for receiving said first and second sets of signals and generating a decimation factor signal; and means for receiving said interpolation signal and said decimation factor signal and generating a decimation signal.

14. The system of claim 13, wherein said decimation signal is a digital representation of said Doppler Effect signal.

15. The system of claim 14, further comprising means for converting said decimation signal to an analog signal.

16. The system of claim 15, further comprising means for producing said Doppler Effect signal audible to a listener.

17. The system of claim 13, further comprising means for converting said audio signal to a digital signal.

* * * * *